United States Patent
Byun

(10) Patent No.: US 11,639,969 B2
(45) Date of Patent: May 2, 2023

(54) DATA PROCESSING SYSTEM AND OPERATING METHOD THEREOF

(71) Applicant: SK hynix Inc., Gyeonggi-do (KR)

(72) Inventor: Eu-Joon Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 917 days.

(21) Appl. No.: 16/384,231

(22) Filed: Apr. 15, 2019

(65) Prior Publication Data

US 2020/0081065 A1   Mar. 12, 2020

(30) Foreign Application Priority Data

Sep. 11, 2018  (KR) .......................... 10-2018-0108308

(51) Int. Cl.
| | | |
|---|---|---|
| *G01R 31/367* | (2019.01) | |
| *G01R 31/387* | (2019.01) | |
| *G11C 16/34* | (2006.01) | |
| *G06F 12/02* | (2006.01) | |
| *G06F 1/3212* | (2019.01) | |

(52) U.S. Cl.
CPC ......... *G01R 31/367* (2019.01); *G01R 31/387* (2019.01); *G06F 1/3212* (2013.01); *G06F 12/0246* (2013.01); *G06F 12/0253* (2013.01); *G11C 16/349* (2013.01)

(58) Field of Classification Search
CPC .............................. G01R 31/367; G01R 31/387
USPC .......................................................... 702/63
See application file for complete search history.

(56) References Cited

U.S. PATENT DOCUMENTS

| | | | | |
|---|---|---|---|---|
| 2016/0179617 | A1 | 6/2016 | Lee | |
| 2016/0259577 | A1* | 9/2016 | Park | ..................... G11C 29/021 |
| 2018/0129416 | A1 | 5/2018 | Kim | |
| 2018/0129604 | A1* | 5/2018 | Kim | .................... G06F 12/0804 |
| 2019/0065331 | A1* | 2/2019 | Singidi | ................ G11C 29/883 |
| 2019/0074053 | A1* | 3/2019 | Bang | ....................... G11C 16/30 |

FOREIGN PATENT DOCUMENTS

| | | |
|---|---|---|
| CN | 101405677 A | 4/2009 |
| CN | 103093818 A | 5/2013 |
| CN | 104380381 A | 2/2015 |
| CN | 104991738 A | 10/2015 |
| KR | 10-2015-0026786 | 3/2015 |
| KR | 10-2017-0075327 | 7/2017 |

OTHER PUBLICATIONS

Office Action for Chinese Patent Application No. 201910795184.3 issued by the Chinese Patent Office dated Mar. 1, 2023.

* cited by examiner

Primary Examiner — Ricky Go
(74) Attorney, Agent, or Firm — IP & T Group LLP

(57) ABSTRACT

A data processing system includes: a host suitable for checking battery state information and determining a battery grade based on the battery state information; and a memory system suitable for storing information indicating the battery grade provided from the host, determining a method of performing a background operation based on the battery grade, and performing the background operation based on the determined method.

18 Claims, 15 Drawing Sheets

ND OPERATING METHOD THEREOF

DATA PROCESSING SYSTEM AND OPERATING METHOD THEREOF

CROSS-REFERENCE TO RELATED APPLICATION

The present application claims priority under 35 U.S.C. § 119(a) to Korean Patent Application No. 10-2018-0108308 filed on Sep. 11, 2018, the disclosure of which is incorporated herein by reference in its entirety.

BACKGROUND

1. Field

Various embodiments of the present invention generally relate to a data processing system. Particularly, the embodiments relate to a data processing system capable of efficiently processing data, and an operating method thereof.

2. Description of the Related Art

The computer environment paradigm has shifted towards ubiquitous computing, which enables computing systems to be used anytime and anywhere. As a result, the demand for portable electronic devices, such as mobile phones, digital cameras, and laptop computers have increased rapidly. Those electronic devices generally include a memory system using a memory device as a data storage device. The data storage device may be used as a main memory unit or an auxiliary memory unit of a portable electronic device.

Since there is no mechanical driving part, a data storage device used as a memory device provides advantages such as excellent stability and durability, high information access speed, and low power consumption. Also, the data storage device can have a higher data access rate and lower power consumption than a hard disk device. Non-limiting examples of the data storage device having such advantages include Universal Serial Bus (USB) memory devices, memory cards of diverse interfaces, Solid-State Drives (SSDs) and the like.

SUMMARY

Various embodiments of the present invention are directed to a memory system capable of efficiently performing a background operation.

In accordance with an embodiment of the present invention, a data processing system may include: a host suitable for checking battery state information and determining a battery grade based on the battery state information; and a memory system suitable for storing information indicating the battery grade provided from the host, determining a method of performing a background operation based on the battery grade, and performing the background operation based on the determined method.

In accordance with an embodiment of the present invention, an operating method of a data processing system may include: checking battery state information; determining a battery grade based on the battery state information; determining a method of performing a background operation based on the battery grade; and performing the background operation based on the determined method.

In accordance with an embodiment of the present invention, a data processing system may include: a host, including a battery, suitable for maintaining battery state information including a plurality of levels, each indicative of a capacity of the battery; and a memory system, including a memory controller, suitable for receiving the battery state information, including a current capacity grade of the battery, from the host, the plurality of levels being associated with a plurality of methods of performing a background operation respectively, identifying the method of performing the background operation associated with the current grade of the battery, and performing the background operation associated with the current grade of the battery.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
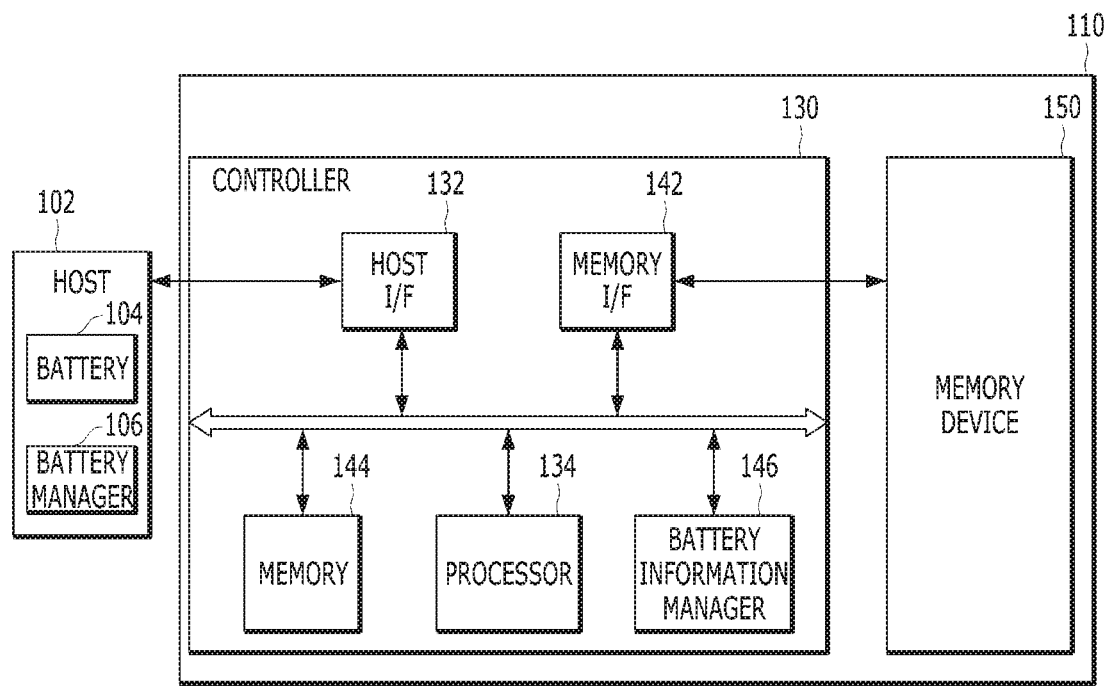
FIG. 1 is a block diagram illustrating a data processing system including a memory system in accordance with an embodiment of the present disclosure.

Various embodiments of the present disclosure are described below in more detail with reference to the accompanying drawings. The present invention, however, may be embodied in different forms, which may be modifications or variations of any of the disclosed embodiments. Thus, the present invention is not limited to the embodiments set forth herein. Rather, the described embodiments are provided so that this disclosure is thorough and complete and fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without departing from the spirit and scope of the present invention.

The drawings are not necessarily to scale and, in some instances, proportions may have been exaggerated in order to clearly illustrate features of the embodiments. The drawings are illustrative, not restrictive.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless the context indicates otherwise.

The terminology used herein is for the purpose of describing particular embodiments only and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a television (TV), a projector and the like.

The host 102 may include a battery 104 and a battery manager 106 for managing the battery 104.

The battery 104 may provide the data processing system 100 with power. The battery 104 may have limited power.

Although the battery 104 is illustrated in FIG. 1 as a constituent element included in the host 102, this is merely one embodiment; the present invention is not limited thereto. According to another embodiment of the present invention, the host 102 and the battery 104 of the data processing system 100 may be separate components. In the context of the description below, the host 102 includes the battery 104.

The battery manager 106 may manage the battery 104. To be specific, the battery manager 106 may check battery state information (for example, currently available capacity of the battery).

Furthermore, the battery manager 106 may classify, based on the detected battery state information, the battery capacity into a plurality of battery levels. For example, when the available capacity of the battery is less than 100% and more than 80%, the battery manager 106 may classify the battery state information as a fifth grade. When the available capacity of the battery is less than 80% and more than 60%, the battery manager 106 may classify the battery state information as a fourth grade. When the available capacity of the battery is less than 60% and more than 40%, the battery manager 106 may classify the battery state information as a third grade. When the available capacity of the battery is less than 40% and more than 20%, the battery manager 106 may classify the battery state information as a second grade. When the available capacity of the battery is less than 20% and more than 10%, the battery manager 106 may classify the battery state information as a first grade. When the available capacity of the battery is less than 10% and more than 0%, the battery manager 106 may classify the battery state information as a 0th grade. However, this is merely one embodiment of a battery state information classification scheme; the present invention is not limited to it. Other suitable classification schemes may be used consistent with the teachings herein.

The battery manager 106 may determine the corresponding battery grade based on the detected battery state information.

The host 102 may provide the memory system 110 with information indicating the determined battery grade. In particular, the host 102 may provide the memory system 110 with the information indicating the determined battery grade when the data processing system 100 is booted. When the battery grade is changed, the host 102 may provide the memory system 110 with the changed battery grade. For example, whenever the battery grade goes up or down, the host 102 may provide the memory system 110 with the changed battery grade.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled to the host 102, according to a protocol of a host interface. Non-limiting examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with any of a variety of memory types including a volatile memory device such, for example, as a dynamic random access memory (DRAM) and a static RAM (SRAM) and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102, and the controller 130 may control storage of data in the memory device 150.

The controller 130 and the memory device 150 may be integrated into a single semiconductor device, which may be included in any of the various types of memory systems as exemplified above.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while an electrical power is not supplied. The memory device 150 may store data provided from the host 102 through a write operation, and provide data stored therein to the host 102 through a read operation. The memory device 150 may include a plurality of memory blocks. Each of the memory blocks may include a plurality of pages. Each of the plurality of pages may include a plurality of memory cells to which a plurality of word lines (WL) are electrically coupled.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102, and/or may store the data, provided by the host 102, into the memory device 150.

The controller 130 may include a host interface (I/F) 132, a processor 134, a memory interface (I/F) 142, a memory 144 and a battery information manager 146, all operatively coupled via an internal bus.

The host interface 132 may process commands and data provided from the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (DATA), small computer system interface (SCSI), enhanced small disk interface (ESDI) and integrated drive electronics (IDE).

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134, when the memory device 150 is a flash memory and, in particular, a NAND flash memory.

The memory 144 may serve as a working memory for the memory system 110 and the controller 130, and may store temporary or transactional data for operating or driving the memory system 110 and the controller 130. The controller 130 may control the memory device 150 in response to a request from the host 102. The controller 130 may deliver data read from the memory device 150 into the host 102, may store data entered through the host 102 within the memory device 150. The memory 144 may be used to store data required for the controller 130 and the memory device 150 in order to perform these operations.

The memory 144 may be implemented with a volatile memory. The memory 144 may be implemented with a static random access memory (SRAM) or a dynamic random access memory (DRAM). Although FIG. 1 exemplifies the memory 144 disposed within the controller 130, the disclosure is not limited thereto. That is, the memory 144 may be located within or externally to the controller 130. For instance, the memory 144 may be embodied by an external volatile memory having a memory interface transferring data and/or signals transferred between the memory 144 and the controller 130.

The battery information manager 146 may store the battery grade provided from the host 102 under the control of the processor 134. When a new battery grade or level is provided from the host 102, the battery information manager 146 may update the battery grade under the control of the processor 134. Although the battery information manager 146 is shown as a constituent element separate from the memory 144 in FIG. 1, the battery information manager 146 may be included in the memory 144.

The processor 134 may be implemented with a microprocessor or a central processing unit (CPU). The memory system 110 may include one or more processors 134.

A management unit (not shown) may be included in the processor 134. The management unit may perform bad block management of the memory device 150. The management unit may find bad memory blocks in the memory device 150, which are in unsatisfactory condition for further use, as well as perform bad block management on the bad memory blocks. When the memory device 150 is a flash memory, for example, a NAND flash memory, a program failure may occur during the write operation (i.e., the program operation), due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 100, and thus reliable bad block management is required.

The processor 134 may perform a background operation for the memory device 150. The background operation may include garbage collection operation, wear-leveling operation, map flush operation and bad block management operation.

The background operation may be performed by the memory system 110 even in the absence of a request of the host 102. If the background operation is frequently performed in the memory system 110, the background operation may excessively consume the limited power of the battery 104.

The processor 134 may determine a method of performing a background operation based on the battery grade stored in the battery information manager 146.

For example, the processor 134 may determine the number of times the background operation is performed based on an execution frequency of a background operation corresponding to each of the battery grades.

For another example, the processor 134 may determine the execution time of the background operation corresponding to each of the battery grades.

However, the present invention is not limited to the above examples.

The processor 134 may perform a background operation in accordance with the determined method of performing a background operation. The processor 134 may perform a background operation in an idle state.

The controller 130 may further include an error correction code (ECC) component and a power management unit (PMU).

The ECC component may detect and correct errors in the data read from the memory device 150 during the read operation. When the number of the error bits is greater than or equal to a threshold number of correctable error bits, the ECC component may not correct error bits but may output an error correction fail signal indicating failure in correcting the error bits.

The ECC component may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and on the like. The ECC component may include all or some of circuits, modules, systems or devices for performing the error correction operation based on at least one of the above described codes.

The PMU may provide and manage power of the controller 130.

Figure 2:
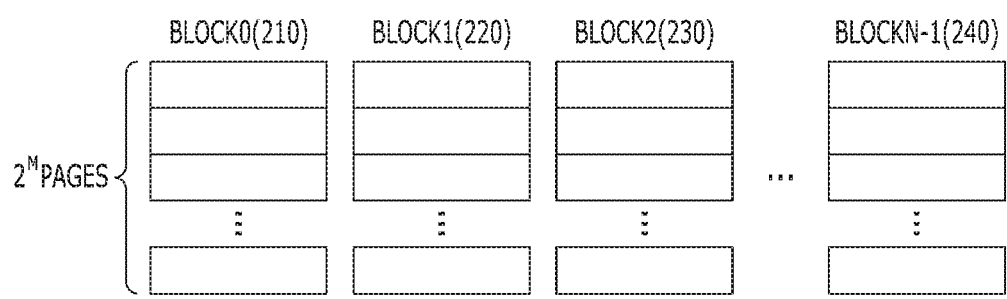
FIG. 2 is a schematic diagram illustrating an exemplary configuration of a memory device of the memory system shown in FIG. 1.

FIG. 2 is a schematic diagram illustrating the memory device 150 of FIG. 1.

Referring to FIG. 2, the memory device 150 may include the plurality of memory blocks, e.g., BLOCK0 210, BLOCK1 220, BLOCK2 230 to BLOCKN−1 240. Each of these blocks may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
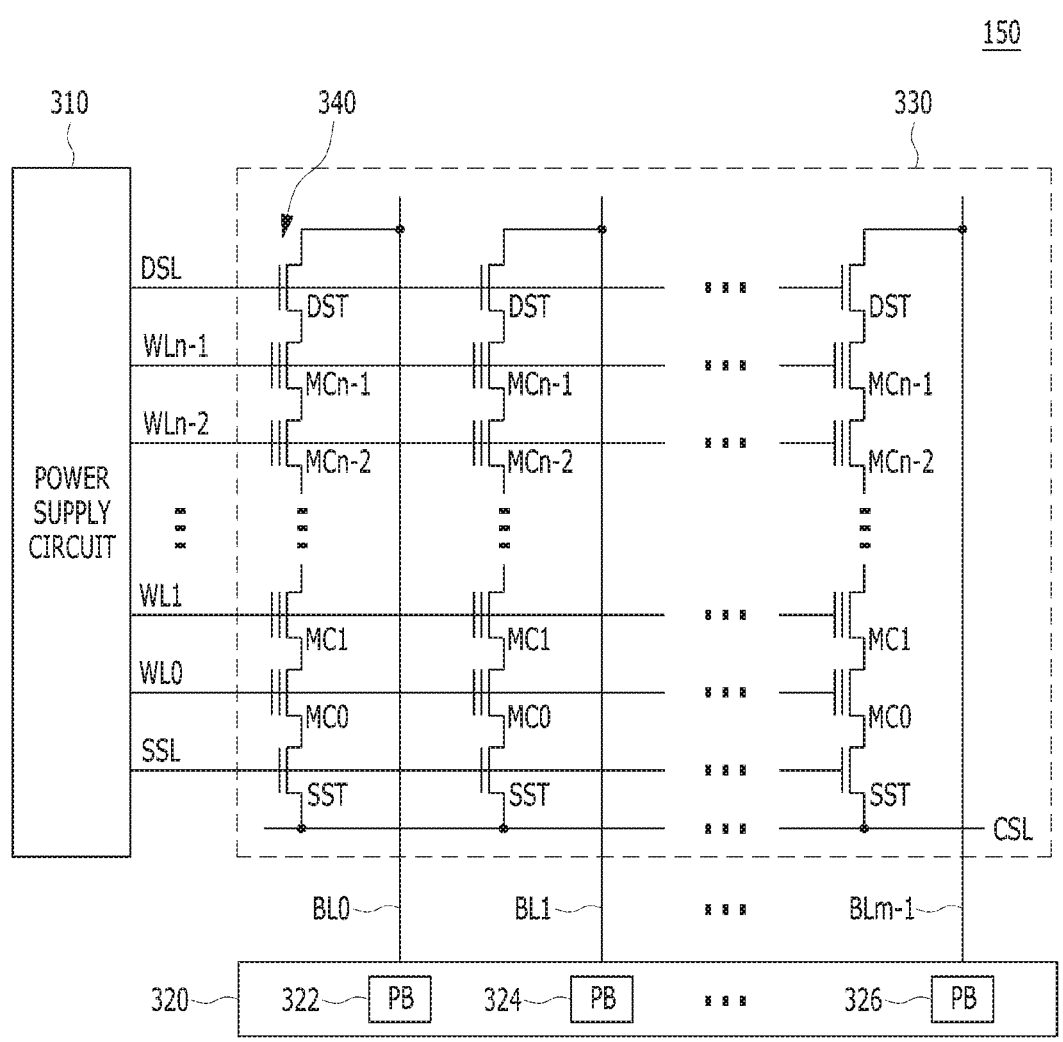
FIG. 3 is a circuit diagram illustrating an exemplary configuration of a memory cell array of a memory block in the memory device shown in FIG. 2.

FIG. 3 is a circuit diagram illustrating a memory block 330 in the memory device 150 of FIG. 2.

Referring to FIG. 3, the memory block 330 may correspond to any of the plurality of memory blocks included in the memory device 150 of the memory system 110.

The memory block 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC) each of which may store 1 bit of information, or by multi-level cells (MLC) each of which may store data information of a plurality of bits. However, the present invention is not limited to just the SLC or MLC. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 shows, as an example, that the memory block 330 is constituted with NAND flash memory cells, it is to be noted that the memory block 330 of the memory device 150 according to embodiments is not limited to a NAND flash memory. The memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read and write (read/write) circuit 320 of the memory device 150 may be controlled by the control circuit, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

Figure 4:
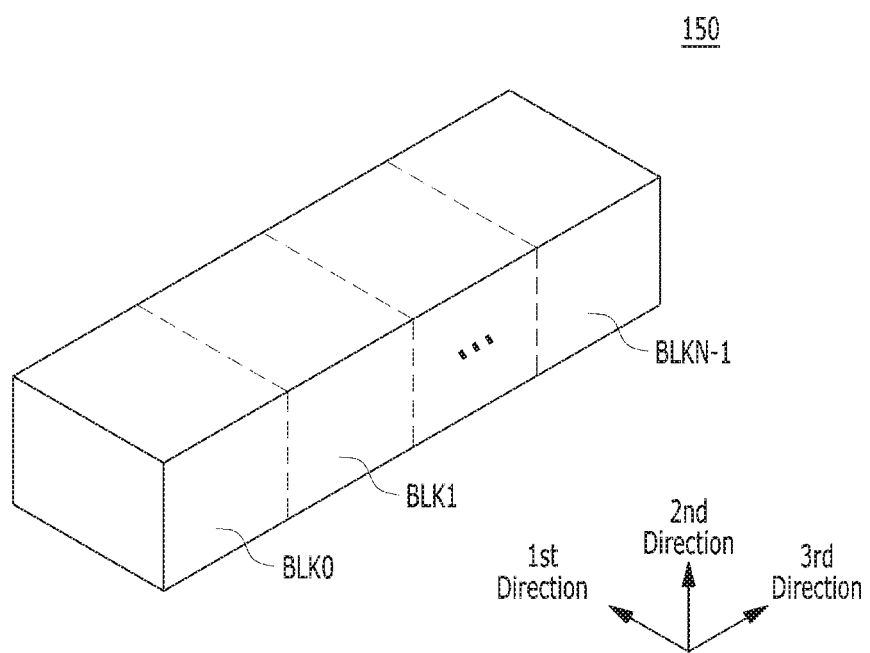
FIG. 4 is a schematic diagram illustrating an exemplary three-dimensional (3D) structure of the memory device shown in FIG. 2.

FIG. 4 is a schematic diagram illustrating a three-dimensional (3D) structure of the memory device 150 of FIG. 1.

Although FIG. 4 shows a 3D structure, the present invention is not limited to such structure. In another embodiment, the memory device 150 may be embodied by a two-dimensional (2D) memory device. As illustrated in FIG. 4, the memory device 150 may be embodied in a nonvolatile memory device having a 3D stack structure. When the memory device 150 has a 3D structure, the memory device 150 may include a plurality of memory blocks BLK0 to BLKN−1 each having a 3D structure (or a vertical structure).

The operation of the data processing system 100 in accordance with an embodiment of the present invention will be described. In the context of the following description, which is one example, the battery is classified into $0^{th}$ to fifth grades. To be specific, when the available capacity of the battery is 100% or less and more than 80%, the battery grade may be set to the fifth grade. When the available capacity of the battery is less than 80% and more than 60%, the battery grade may be set to the fourth grade. When the available capacity of the battery is less than 60% and more than 40%, the battery grade may be set to the third grade. When the available capacity of the battery is less than 40% and more than 20%, the battery grade may be set to the second grade. When the available capacity of the battery is less than 20% and more than 10%, the battery grade may be set to the first grade. When the available capacity of the battery is less than 10% and more than 0%, the battery grade may be set to the 0th grade. However, the present invention is not limited to any specific number of grades nor a capacity range for any particular grade.

FIGS. 5A to 5F are diagrams showing an operation of the data processing system 100 in accordance with an embodiment of the present invention. Particularly, FIGS. 5A to 5F illustrate an operation of the data processing system 100 in which a background operation is performed a particular number of times, which number depends on the battery grade. The number of times that the background operation is performed may be different for the different grades.

By way of example, the data processing system 100 performs a background operation a total of five times in order to complete the background operation. Also, as an example, the data processing system 100 shown in FIGS. 5A to 5F performs a background operation of migrating data stored in a source memory block into a destination memory block. Furthermore, as an example, the background operation of migrating first to fifth data stored in the source memory block shown in FIGS. 5A to 5F into the destination memory block is performed a total of five times. In other words, a background operation may have to be performed once to migrate the first data stored in the source memory block into the destination memory block.

Figure 5A:
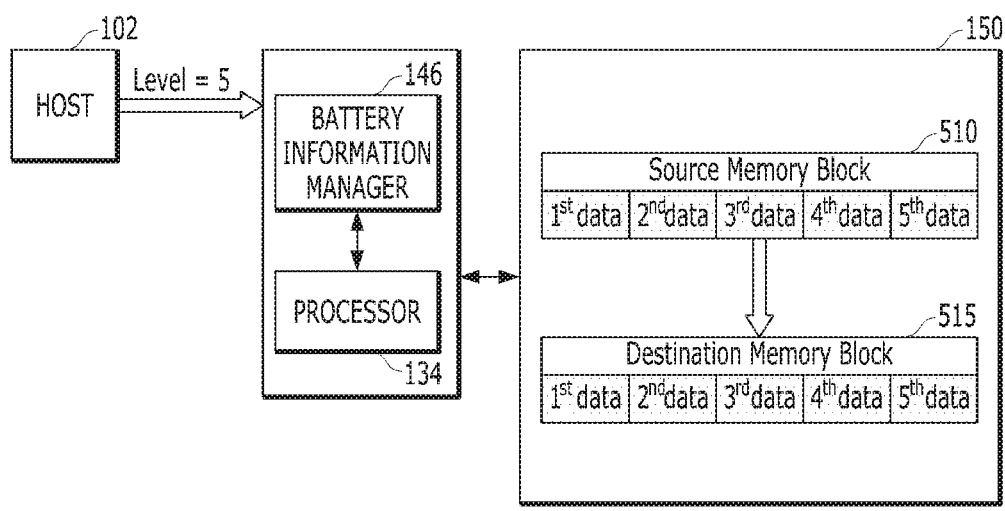
FIGS. 5A to 5F are diagrams illustrating an operation of a data processing system in accordance with an embodiment of the present disclosure.

Referring to FIG. 5A, the host 102 may provide the controller 130 with information indicating the fifth grade (i.e., Level=5), which corresponds to the currently available capacity of the battery 104. As a result, it may be seen that the currently available capacity of the battery is less than 100% and more than 80%.

The battery information manager 146 may store the information indicating the battery grade provided from the host 102. The processor 134 may determine the background operation method based on the battery grade. Since the battery capacity is in the fifth grade, the processor 134 may set the background operation to be performed five times.

Subsequently, the processor 134 may migrate all of the first to fifth data stored in the source memory block 510 into the destination memory block 515.

Figure 5B:
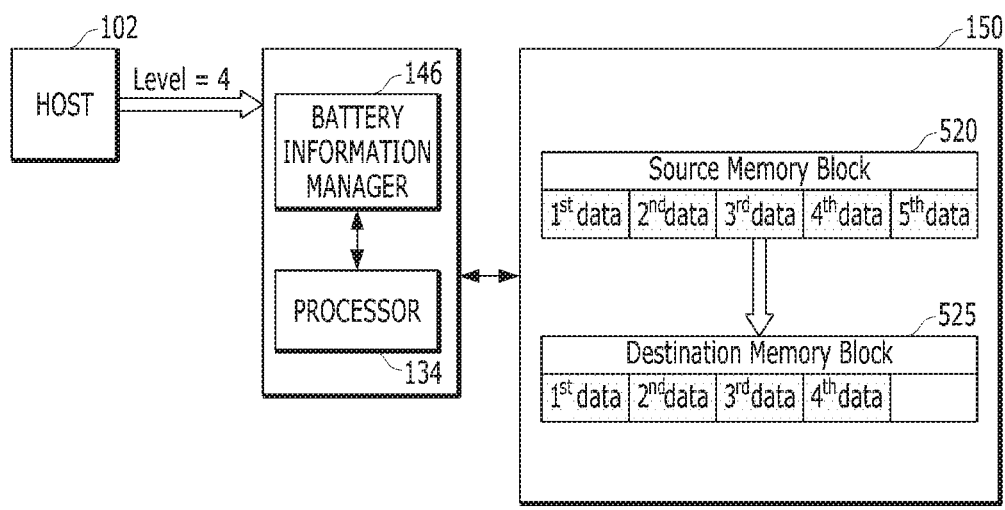

Referring to FIG. 5B, the host 102 may provide the controller 130 with information indicating the fourth grade (i.e., Level=4), which corresponds to the currently available capacity of the battery 104. As a result, it may be seen that the currently available capacity of the battery is less than 80% and more than 60%.

The battery information manager 146 may store the information indicating the battery grade provided from the host 102. The processor 134 may then determine the background operation method based on the battery grade. Since the battery capacity is in the fourth grade, the processor 134 may set the background operation to be performed four times.

The processor 134 may then migrate the first to fourth data stored in the source memory block 520 into the destination memory block 525.

Figure 5C:
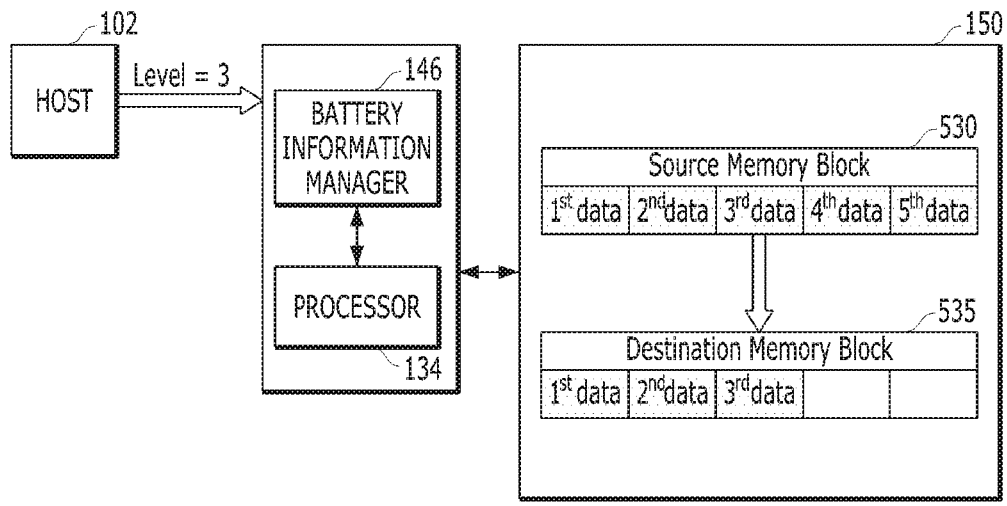

Referring to FIG. 5C, the host 102 may provide the controller 130 with information indicating the third grade (i.e., Level=3), which corresponds to the currently available capacity of the battery 104. As a result, it may be seen that the currently available capacity of the battery is less than 60% and more than 40%.

The battery information manager 146 may store the information indicating the battery grade provided from the host 102. The processor 134 may then determine the background operation method based on the battery grade. Since the battery capacity is in the third grade, the processor 134 may set the background operation to be performed three times.

The processor 134 may then migrate the first to third data stored in the source memory block 530 into the destination memory block 535.

Figure 5D:
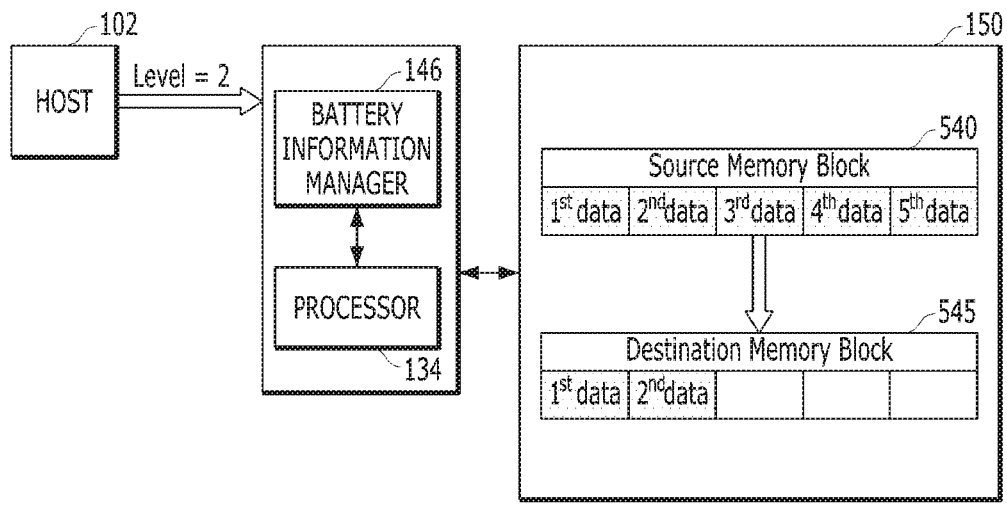

Referring to FIG. 5D, the host 102 may provide the controller 130 with information indicating the second grade (i.e., Level=2), which corresponds to the currently available capacity of the battery 104. As a result, it may be seen that the currently available capacity of the battery is less than 40% and more than 20%.

The battery information manager 146 may store the information indicating the battery grade provided from the host 102. The processor 134 may then determine the background operation method based on the battery grade. Since the battery capacity is in the second grade, the processor 134 may set the background operation to be performed two times.

The processor 134 may then migrate the first and second data stored in the source memory block 540 into the destination memory block 545.

Figure 5E:
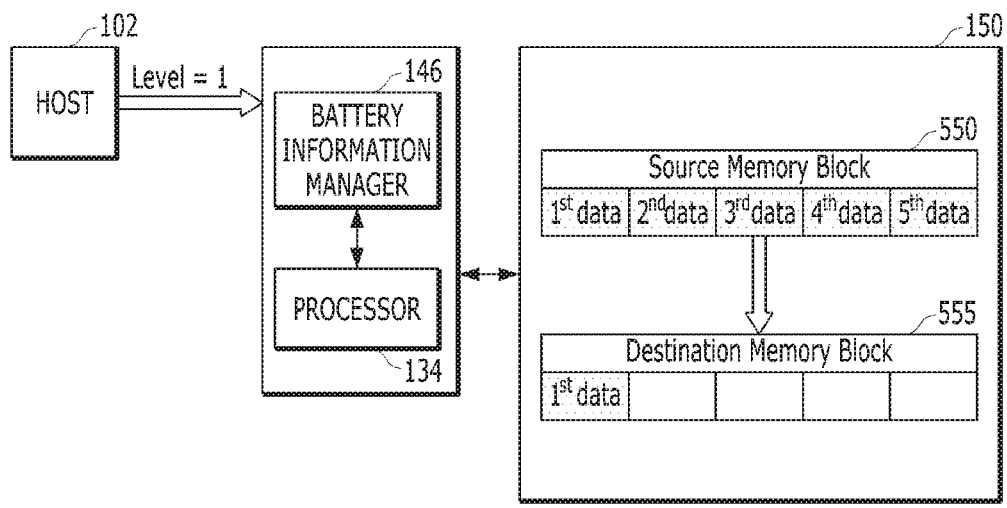

Referring to FIG. 5E, the host 102 may provide the controller 130 with information indicating the first grade (i.e., Level=1), which corresponds to the currently available capacity of the battery 104. As a result, it may be seen that the currently available capacity of the battery is less than 20% and more than 10%.

The battery information manager 146 may store the information indicating the battery grade provided from the host 102. The processor 134 may then determine the background operation method based on the battery grade. Since the battery capacity is in the first grade, the processor 134 may set the background operation to be performed once.

The processor 134 may then migrate only the first data stored in the source memory block 550 into the destination memory block 555.

Figure 5F:
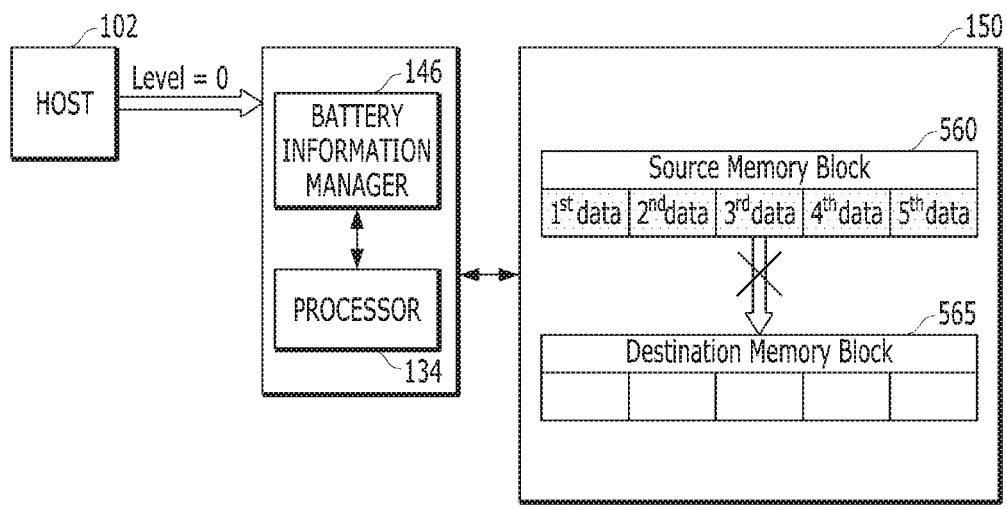

Lastly, referring to FIG. 5F, the host 102 may provide the controller 130 with information indicating the 0th grade (i.e., Level=0), which corresponds to the currently available capacity of the battery 104. As a result, it may be seen that the currently available capacity of the battery is less than 10% and more than 0%.

The battery information manager 146 may store the information indicating the battery grade provided from the host 102. The processor 134 may then determine the background operation method based on the battery grade. Since the battery capacity is in the $0^{th}$ grade, the processor 134 may not perform a background operation.

As described above, the data processing system 100 may save battery power by varying the number of times that a background operation is performed based on the currently available capacity of the battery 104.

FIGS. 6A to 6F are diagrams illustrating an operation of the data processing system 100 in accordance with an embodiment of the present invention. In particular, FIGS. 6A to 6F shows that the data processing system 100 performs a background operation for a particular execution time which is set differently according to each battery grade.

In the context of the following description, the memory system 110 may have an idle time for approximately 100 ms. Also, the memory system 110 may have to perform a background operation for approximately 100 ms in order to completely terminate the background operation.

Figure 6A:
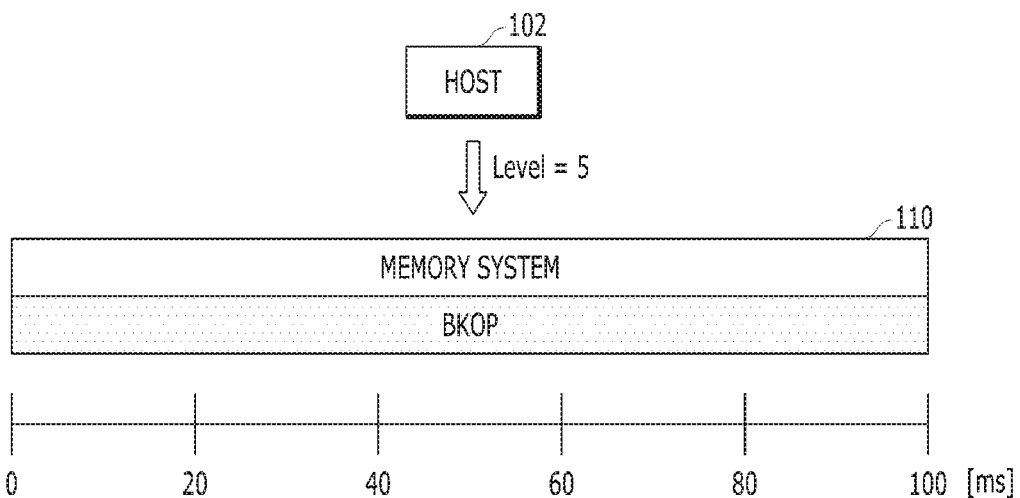
FIGS. 6A to 6F are diagrams illustrating an operation of a data processing system in accordance with an embodiment of the present disclosure.

Referring to FIG. 6A, the host 102 may provide the controller 130 with information indicating the fifth grade (i.e., Level=5), which corresponds to the currently available battery capacity. As a result, it may be seen that the currently available capacity of the battery is less than 100% and more than 80%.

The battery information manager 146 may store the information indicating the battery grade provided from the host 102. The processor 134 included in the memory system 110 may determine a background operation method based on the battery grade. Since the battery is in the fifth grade, the processor 134 may set a background operation to be performed for approximately 100 ms.

The memory system 110 may then perform a background operation (i.e., BKOP) for approximately 100 ms.

Figure 6B:
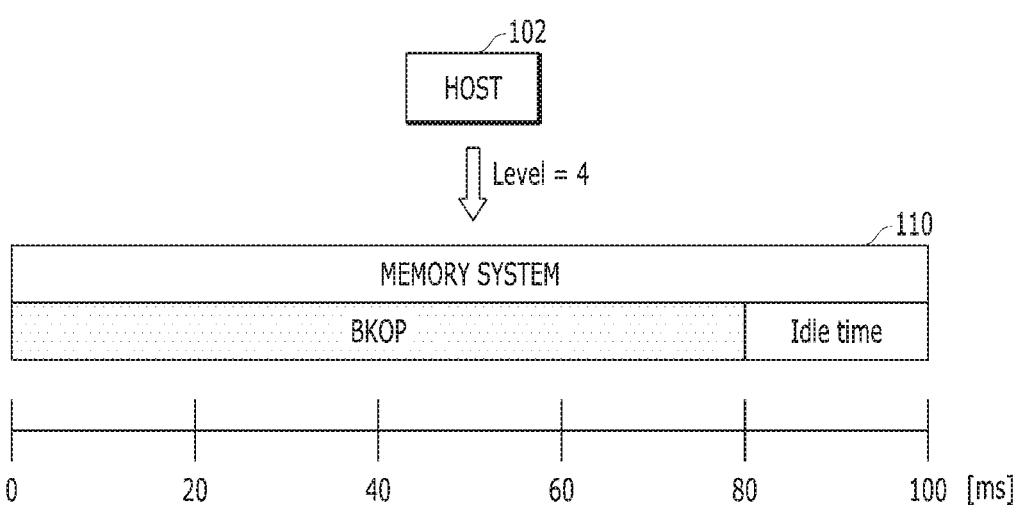

Referring to FIG. 6B, the host 102 may provide the controller 130 with information indicating the fourth grade (i.e., Level=4), which corresponds to the currently available battery capacity. As a result, it may be seen that the currently available capacity of the battery is less than 80% and more than 60%.

Since the battery capacity is in the fourth grade, the processor 134 included in the memory system 110 may set a background operation to be performed for approximately 80 ms.

The memory system 110 may then perform a background operation (i.e., BKOP) for approximately 80 ms. The memory system 110 may not perform a background operation for the remaining approximately 20 ms, which may be idle time.

Figure 6C:
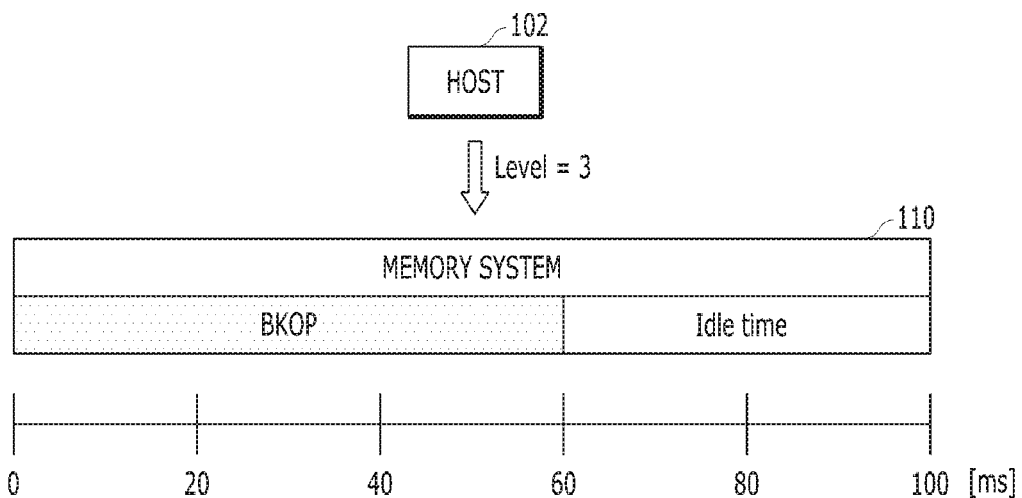

Referring to FIG. 6C, the host 102 may provide the controller 130 with information indicating the third grade (i.e., Level=3), which corresponds to the currently available battery capacity. As a result, it may be seen that the currently available capacity of the battery is less than 60% and more than 40%.

Since the battery is in the third grade, the processor 134 included in the memory system 110 may set a background operation to be performed for approximately 60 ms.

The memory system 110 may then perform a background operation (i.e., BKOP) for approximately 60 ms. The memory system 110 may not perform a background operation for the remaining approximately 40 ms, which may be idle time.

Figure 6D:
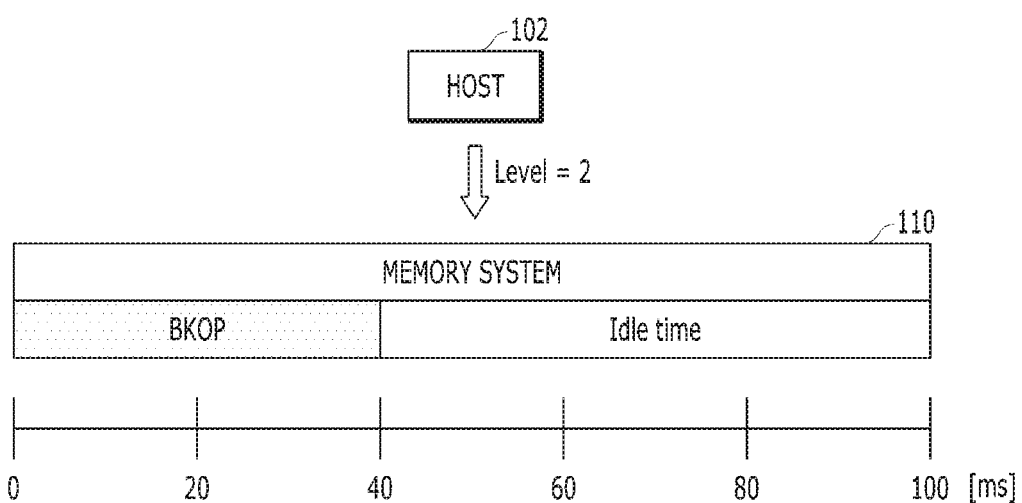

Referring to FIG. 6D, the host 102 may provide the controller 130 with information indicating the second grade (i.e., Level=2), which corresponds to the currently available battery capacity. As a result, it may be seen that the currently available capacity of the battery is less than 40% and more than 20%.

Since the battery capacity is in the second grade, the processor 134 included in the memory system 110 may set a background operation to be performed for approximately 40 ms.

The memory system 110 may then perform a background operation (i.e., BKOP) for approximately 40 ms. The memory system 110 may not perform a background operation for the remaining approximately 60 ms, which may be idle time.

Figure 6E:
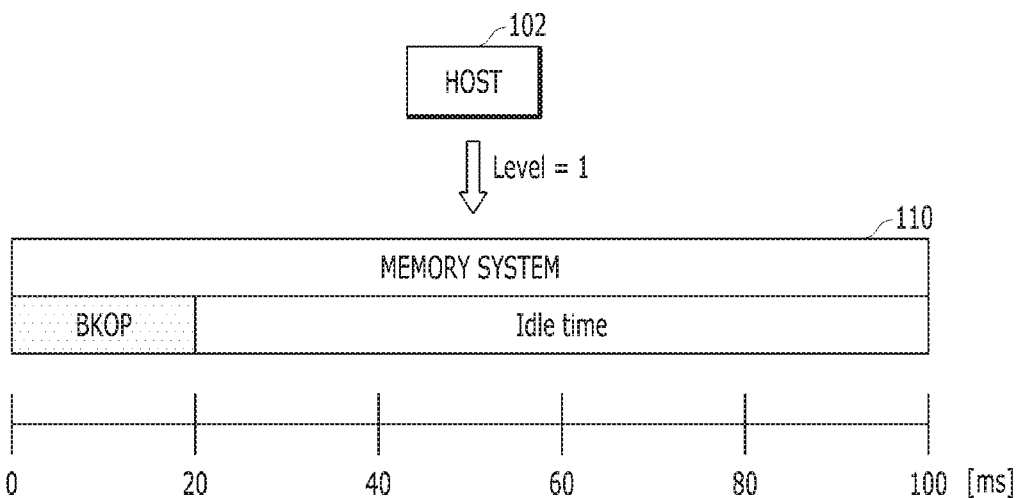

Referring to FIG. 6E, the host 102 may provide the controller 130 with information indicating the first grade (i.e., Level=1), which corresponds to the currently available battery capacity. As a result, it may be seen that the currently available capacity of the battery is less than 20% and more than 10%.

Since the battery capacity is in the first grade, the processor 134 included in the memory system 110 may set a background operation to be performed for approximately 20 ms.

The processor 134 may perform a background operation for approximately 20 ms. The data processing system 100 may not perform a background operation for approximately 80 ms, which may be idle time.

Figure 6F:
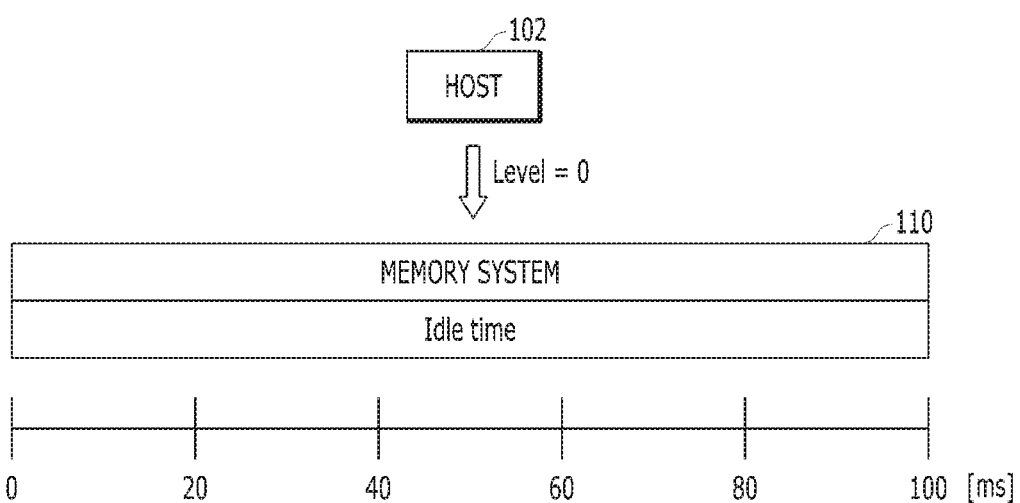

Lastly, referring to FIG. 6F, the host 102 may provide the controller 130 with information indicating the $0^{th}$ grade (i.e., Level=0), which corresponds to the currently available battery capacity. As a result, it may be seen that the currently available capacity of the battery is less than 10% and more than 0%.

Since the battery capacity is in the $0^{th}$ grade, the memory system 110 may not perform a background operation at all.

As described above, the data processing system 100 may save battery power by varying the times for performing a background operation based on the currently available capacity of the battery.

Figure 7:
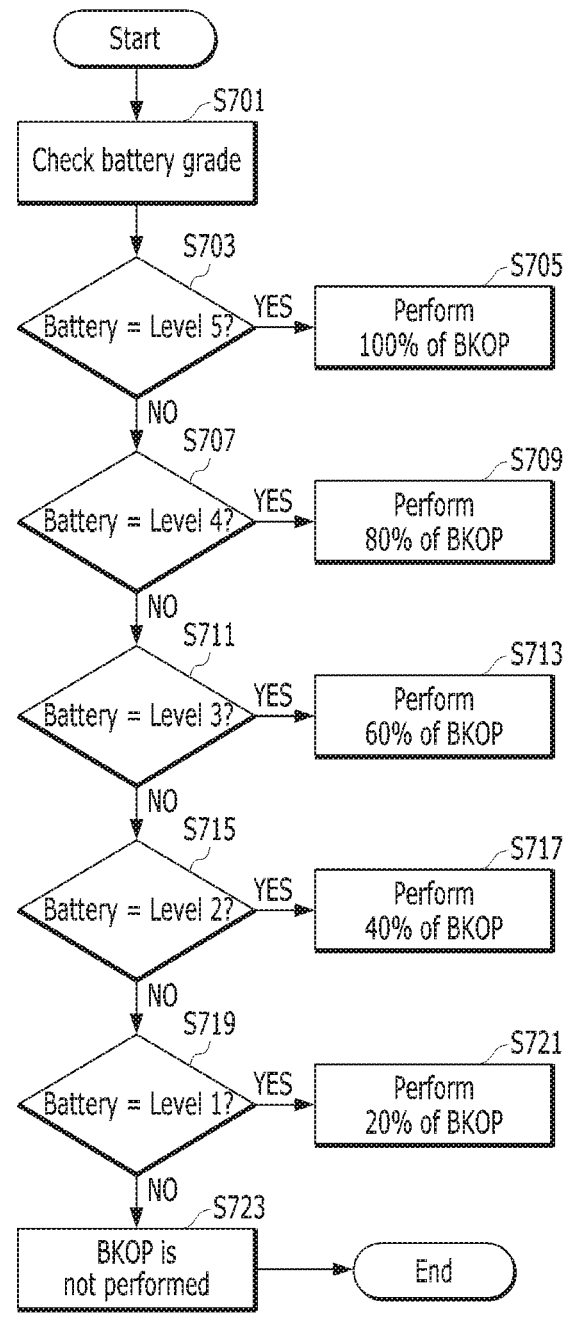
FIG. 7 is a flowchart illustrating an operation of a data processing system in accordance with an embodiment of the present disclosure.

FIG. 7 is a flowchart illustrating an operation of the memory system 110 in accordance with an embodiment of the present invention. In particular, FIG. 7 illustrates performance of a background operation of the memory system 110, depending on the determined battery grade or level. However, the background operation illustrated in FIG. 7 is not more than a mere embodiment of the present invention, and the concept and spirit of the present invention are not limited to it.

At step S701, the processor 134 may check information indicating the battery grade stored in the battery information manager 146.

When it is determined, as a result of the check, that the battery is in the fifth grade (i.e., Level=5) ('Yes' at step S703), at step S705, the processor 134 may perform 100% of the background operation (i.e., BKOP) without limiting it.

When it is determined, as a result of the check, that the battery is not in the fifth grade ('No' at the step S703) but in the fourth grade (i.e., Level=4) ('Yes' at step S707), at step S709, the processor 134 may perform only BO % of the background operation (i.e., BKOP). For example, the processor 134 may limit the number of times the background operation is performed or the execution time of the background operation to as much as 80%.

When it is determined, as a result of the check, that the battery is not in the fourth grade ('No' at the step S707) but in the third grade (i.e., Level=3) ('Yes' at step S711), at step S713, the processor 134 may limit the number of times the background operation (i.e., BKOP) is performed or the execution time of the background operation to as much as 60%.

When it is determined, as a result of the check, that the battery is not in the third grade ('No' at the step S711) but in the second grade (i.e., Level=2) ('Yes' at step S715), at step S717, the processor 134 may limit the number of times the background operation (i.e., BKOP) is performed or the execution time of the background operation to as much as 40%.

When it is determined, as a result of the check, that the battery is not in the second grade ('No' at the step S715) but in the first grade (i.e., Level=1) ('Yes' at step S719), at step S721, the processor 134 may limit the number of times the background operation (i.e., BKOP) is performed or the execution time of the background operation to as much as 20%.

When it is determined, as a result of the check, that the battery is not in the first grade ('No' at the step S719), at step S723, the processor 134 may not perform a background operation (i.e., BKOP).

As described above, the controller 130 in accordance with embodiments of the present invention may classify the battery state into one of a plurality of grades based on the battery state information (for example, available capacity) of the data processing system 100, and perform a background operation based on the battery grade. The classification grade may change as the battery state is reevaluated. In this way, the battery usage efficiency of the data processing system 100 may be increased.

A data processing system and electronic devices which may be implemented with the memory system 110 including the memory device 150 and the controller 130, which have been described above, will be described in detail with reference to FIGS. 8 to 16.

FIGS. 8 to 16 are diagrams schematically illustrating application examples of the data processing system of FIGS. 1 to 7 according to various embodiments.

Figure 8:
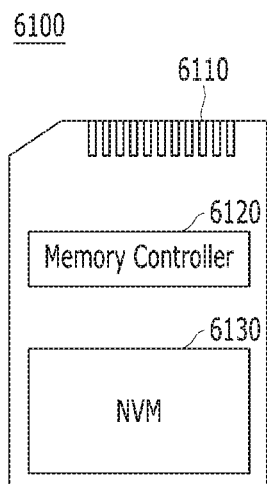
FIGS. 8 to 16 are diagrams schematically illustrating application examples of a data processing system, in accordance with various embodiments of the present invention.

FIG. 8 is a diagram schematically illustrating an example of the data processing system including the memory system in accordance with an embodiment. FIG. 8 schematically illustrates a memory card system 6100 as an application of the memory system in accordance with an embodiment.

Referring to FIG. 8, the memory card system 6100 may include a memory controller 6120, a memory device 6130 and a connector 6110.

More specifically, the memory controller 6120 may be connected to the memory device 6130, and may be configured to access the memory device 6130. The memory device 6130 may be embodied by a nonvolatile memory (NVM). By way of example but not limitation, the memory controller 6120 may be configured to control read, write, erase and background operations onto the memory device 6130. The memory controller 6120 may be configured to provide an interface between the memory device 6130 and a host (not shown) and/or a drive firmware for controlling the memory device 6130. That is, the memory controller 6120 may correspond to the controller 130 in the memory system 110 described with reference to FIGS. 1 to 7, while the memory device 6130 may correspond to the memory device 150 described with reference to FIGS. 1 to 7.

Thus, as shown in FIG. 1, the memory controller 6120 may include a random access memory (RAM), a processor, a host interface, a memory interface and an error correction code component. The memory controller 6120 may further include the elements described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system in accordance with an embodiment may be applied to wired and/or wireless electronic devices or particularly mobile electronic devices.

The memory device 6130 may be implemented by a nonvolatile memory (NVM). For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (SIT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may be so integrated to form a solid state driver (SSD). In another embodiment, the memory controller 6120 and the memory device 6130 may be so integrated to form a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), a secured digital (SD) card (e.g., SD, miniSD, microSD and SDRC) and/or a universal flash storage (UFS).

Figure 9:
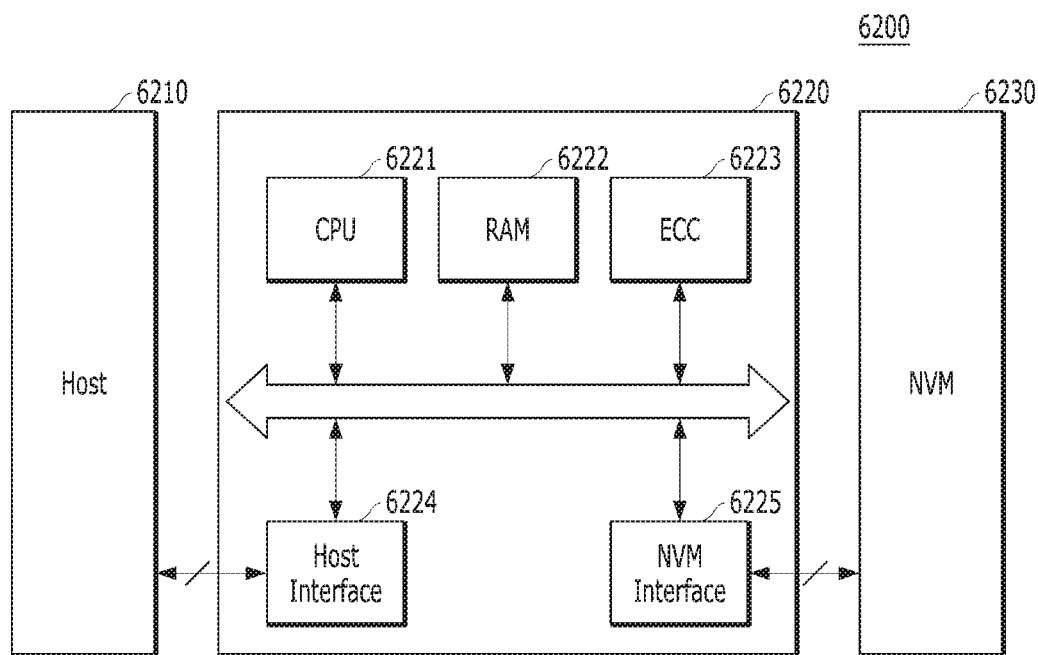

FIG. 9 is a diagram schematically illustrating another example of a data processing system 6200 including a memory system, in accordance with an embodiment.

Referring to FIG. 9, the data processing system 6200 may include a memory device 6230 having one or more nonvolatile memories (NVMs) and a memory controller 6220 for controlling the memory device 6230. The data processing system 6200 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 7, and the memory controller 6220 may correspond to the controller 130 in the memory system 110 described in FIGS. 1 to 7.

The memory controller 6220 may control a read, write, or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. in this case, the ECC circuit 6223 may correct an error using the parity bit. For example, as described with reference to FIG. 1, the ECC circuit 6223 may correct an error using Low Density Parity Check (LDDC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may exchange data with the host 6210 data or signals through the host interface 6224, and may exchange data with the memory device 6230 data or signals through the NVM interface 6225. The host interface 6224 may be connected to the host 6210 through a parallel advanced technology attachment (PATA) bus, a serial advanced technology attachment (SATA) bus, a small computer system interface (SCSI), a universal serial bus (USB), a peripheral component interconnect-express (PCIe), or a NAND interface. The memory controller 6220 may have a wireless communication function with a mobile communication protocol such as wireless fidelity (WiFi) or Long Term Evolution (LTE). The memory controller 6220 may be connected to an external device, e.g., the host 6210, or another external device, and then transmit and/or receive data to and/or from the external device. As the memory controller 6220 is configured to communicate with the external device through one or more of various communication protocols, the memory system and the data processing system may be applied to wired and/or wireless electronic devices, particularly a mobile electronic device.

Figure 10:
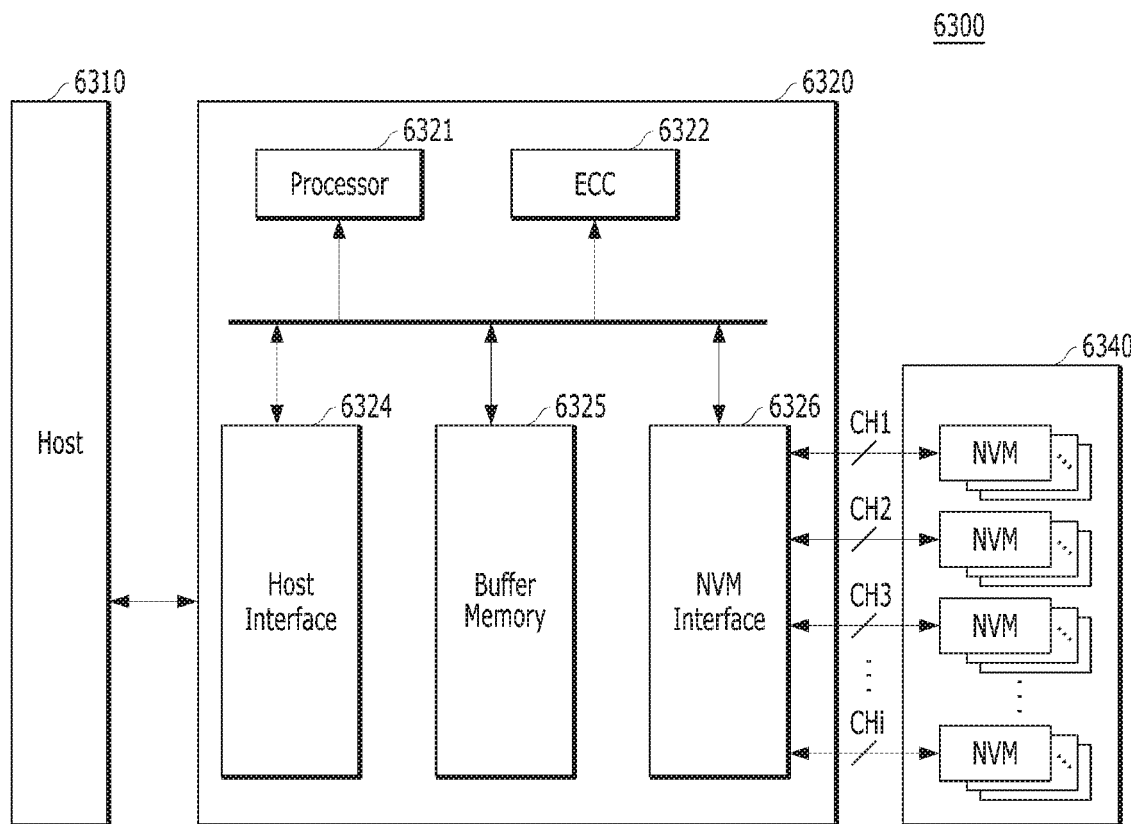

FIG. 10 is a diagram schematically illustrating another example of the data processing system including the memory system in accordance with an embodiment. FIG. 10 schematically illustrates a solid state drive (SSD) 6300 to which the memory system in accordance with an embodiment is applied.

Referring to FIG. 10, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by any of various volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). In the embodiment of FIG. 10, the buffer memory 6325 is disposed in the controller 6320, but in another embodiment the buffer memory 6325 may be located or arranged externally the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, i.e., RAID level information of the write command provided from the host 6310 in the SSDs 6300, and may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 11:
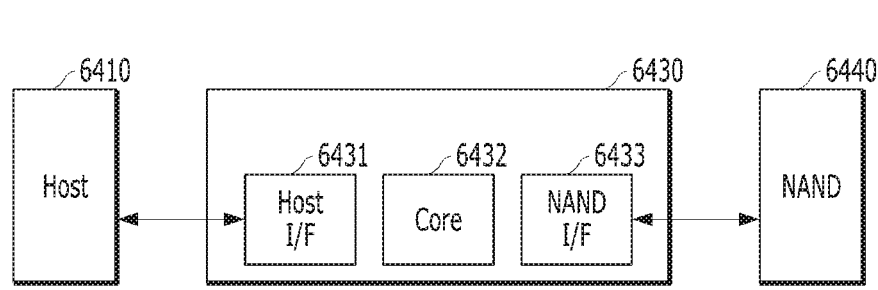

FIG. 11 is a diagram schematically illustrating another example of the data processing system including the memory system in accordance with an embodiment. FIG. 11 schematically illustrates an embedded Multi-Media Card (eMMC) 6400 to which the memory system is applied.

Referring to FIG. 11, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control the operations of the eMMC 6400, the host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 12 to 15 are diagrams schematically illustrating other examples of the data processing system including the memory system in accordance with an embodiment. FIGS. 12 to 15 schematically illustrate universal flash storage (UFS) systems 6500, 6600, 6700 and 6800, to which the memory system is applied.

Referring to FIGS. 12 to 15, the UFS systems 6500, 6600, 6700 and 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired and/or wireless electronic devices, particularly mobile electronic devices, the UFS devices 6520, 6620, 6720, 6820 may serve as embedded UFS devices. The UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700 and 6800 may communicate with external devices, e.g., wired and/or wireless electronic devices or particularly mobile electronic devices through UFS protocols. The UFS devices 6520, 6620, 6720, 6820 and the UFS cards 6530, 6630, 6730, 6830 may be embodied by the memory system 110 illustrated in FIG. 1, For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 9 to 11, and the UFS cards 6530, 6630, 6730, 6830 may be embodied in the form of the memory card system 6100 described with reference to FIG. 8.

Furthermore, in the UFS systems 6500, 6600, 6700 and 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, e.g., universal storage bus (USB) Flash Drives (UFDs), multi-media card (MMC), secure digital (SD), mini-SD, and micro-SD.

Figure 12:
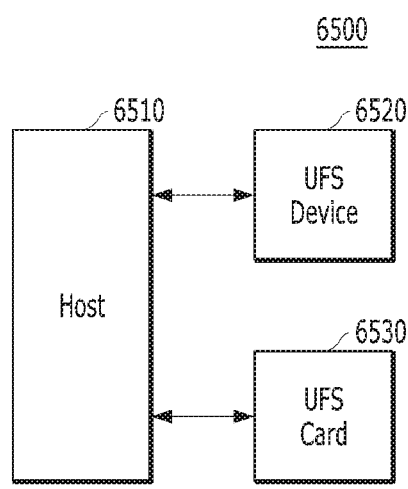

In the UFS system 6500 illustrated in FIG. 12, each of the host 6510, the UFS device 6520 and the UFS card 6530 may include UniPro. The host 6510 may perform a switching operation to communicate with at least one of the UFS device 6520 and the UFS card 6530. The host 6510 may communicate with the UFS device 6520 or the UFS card 6530 through link layer switching, e.g., L3 switching at the UniPro. In this case, the UFS device 6520 and the UFS card 6530 may communicate with each other through a link layer switching at the UniPro of the host 6510. FIG. 12 illustrates the configuration in which one UFS device 6520 and one UFS card 6530 are connected to the host 6510. However, in another embodiment, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520. Herein, the form of a star means an arrangement in which a single device is coupled with plural other devices or cards for centralized control.

Figure 13:
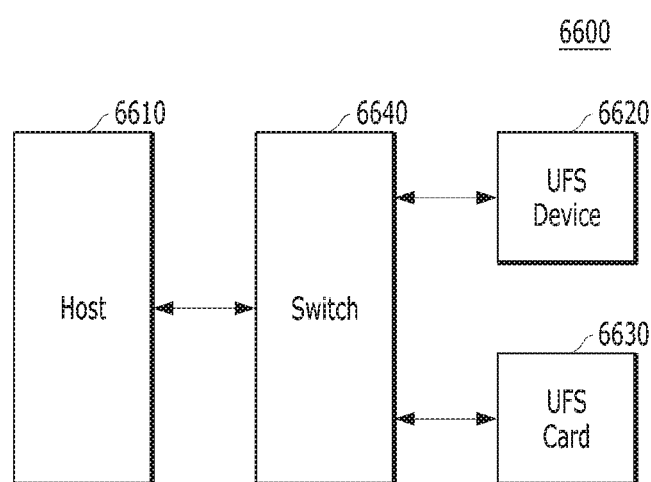

In the UFS system 6600 illustrated in FIG. 13, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. FIG. 13 illustrates the configuration in which one UFS device 6620 and one UFS card 6630 are connected to the switching module 6640. However, in another embodiment, a plurality of UFS devices and UFS cards may be connected in parallel or in the form of a star to the switching module 6640, and a plurality of UFS cards may be connected in series or in the form of a chain to the UFS device 6620.

Figure 14:
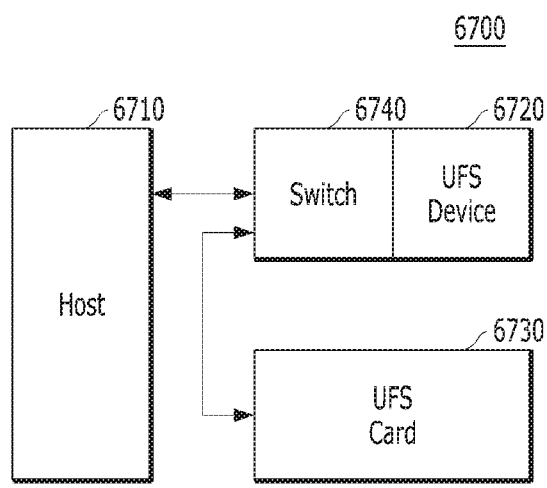

In the UFS system 6700 illustrated in FIG. 14, each of the host 6710, the UFS device 6720 and the UFS card 6730 may include UniPro. The host 6710 may communicate with the UFS device 6720 or the UFS card 6730 through a switching module 6740 performing a switching operation, for example, the switching module 6740 which performs link layer switching at the UniPro, for example, L3 switching. In this case, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. FIG. 14 illustrates the configuration in which one UFS device 6720 and one UFS card 6730 are connected to the switching module 6740. However, in another embodiment, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 15:
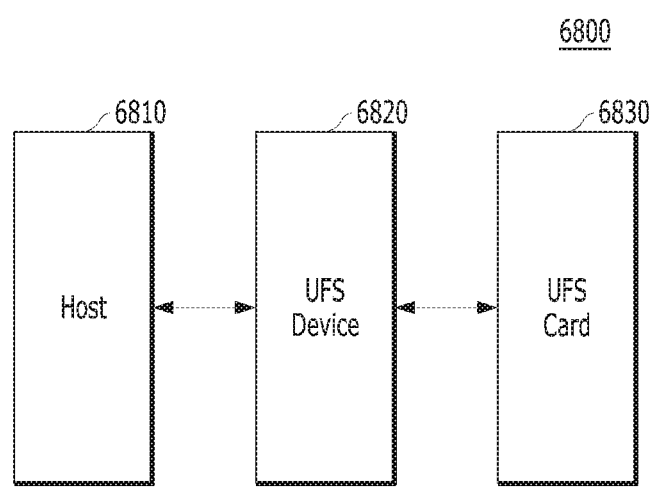

In the UFS system 6800 illustrated in FIG. 15, each of the host 6810, the UFS device 6820 and the UFS card 6830 may include M-PHY and UniPro. The UFS device 6820 may perform a switching operation to communicate with the host 6810 and the UFS card 6830. The UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. Here, the host 6810 and the UFS card 6830 may communicate with each other through target ID switching between the M-PHY and UniPro modules of the UFS device 6820. FIG. 15 illustrates the configuration in which one UFS device 6820 is connected to the host 6810 and one UFS card 6830 is connected to the UFS device 6820. However, in another embodiment, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 16:
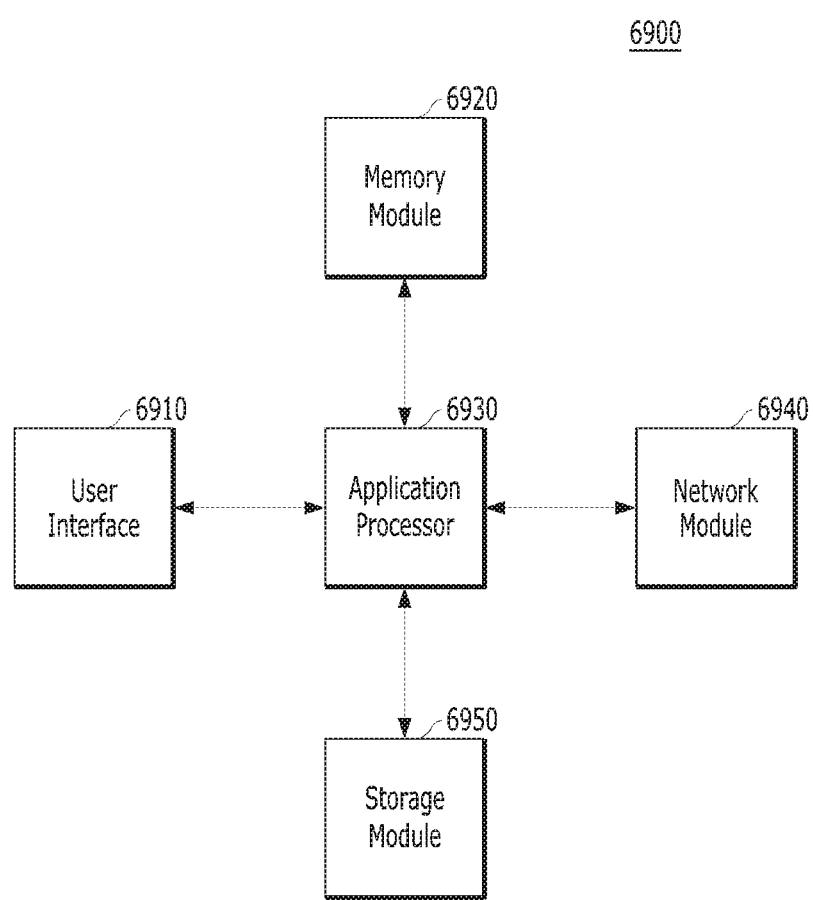

FIG. 16 is a diagram schematically illustrating another example of the data processing system including the memory system in accordance with an embodiment. FIG. 16 is a diagram schematically illustrating a user system 6900 to which the memory system in accordance with an embodiment is applied.

Referring to FIG. 16, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 10 to 15.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired and/or wireless communication with an external device. The user interface 6910 may display data processed by the processor 6930 on a display and touch module of the mobile electronic device, or support a function of receiving data from the touch panel.

While the present invention has been illustrated and described with respect to specific embodiments, it will be apparent to those skilled in the art in light of the present disclosure that various changes and modifications may be made without departing from the spirit and scope of the invention as determined in the following claims.

What is claimed is:

1. A data processing system, comprising:
a host suitable for checking battery state information and determining a battery grade based on the battery state information; and
a memory system suitable for storing information indicating the battery grade provided from the host, determining a method of performing a background operation based on the battery grade, and performing the background operation based on the determined method,
wherein the memory system includes a controller suitable for storing the information indicating the battery grade,
wherein the controller includes a processor suitable for determining the method based on the information indicating the battery grade, and
wherein the processor sets an execution frequency corresponding to the battery grade as the number of times that the background operation is performed.

2. The data processing system of claim 1, wherein the host includes:
a battery suitable for supplying electric power; and
a battery manager suitable for checking the battery state information and determining the battery grade based on the battery state information.

3. The data processing system of claim 1, wherein the host provides the memory system with the information indicating the battery grade when a booting operation is performed.

4. The data processing system of claim 1, wherein the host provides the memory system with the information indicating the battery grade when the battery grade is changed.

5. The data processing system of claim 1, wherein the memory system further includes:
a memory device, wherein the controller determines the method for performing the background operation based on the information indicating the battery grade, and controls the memory device to perform the background operation according to the determined method.

6. The data processing system of claim 5, wherein the controller further includes:
a battery information manager suitable for storing the information indicating the battery grade,
wherein the processor controls the memory device to perform the background operation based on the determined method.

7. The data processing system of claim 6, wherein the processor sets an execution time of the background operation corresponding to the battery grade of the background operation.

8. The data processing system of claim 6, wherein the battery information manager updates the stored information indicating the battery grade, when an updated battery grade is provided.

9. The data processing system of claim 1, wherein the background operation includes any of a garbage collection operation, a read reclaim operation, and a wear-leveling operation.

10. The data processing system of claim 1, wherein the battery state information includes information representing available capacity of the battery.

11. A method for operating a data processing system including a host and a memory system, the method comprising:
checking battery state information;
determining a battery grade based on the battery state information;
determining a method of performing a background operation based on the battery grade; and
performing the background operation based on the determined method,
wherein the determining of the method of performing the background operation based on the battery grade comprises setting an execution frequency corresponding to the battery grade as the number of times that the background operation is performed.

12. The method of claim 11, wherein the determining of the method of performing the background operation based on the battery grade comprises setting an execution time corresponding to the battery grade as an execution time of the background operation.

13. The method of claim 11, further comprising:
providing information indicating the battery grade from the host to the memory system, when a booting operation is performed.

14. The method of claim 11, further comprising:
providing information indicating the battery grade from the host to the memory system, when the battery grade is changed.

15. The method of claim 11, further comprising:
storing information indicating the battery grade to a battery information manager in the memory system.

16. A data processing system comprising:
a host, including a battery, suitable for maintaining battery state information including a plurality of levels, each indicative of a capacity of the battery; and
a memory system, including a memory controller, suitable for
receiving the battery state information, including a current capacity grade of the battery, from the host, the plurality of levels being associated with a plurality of methods of performing a background operation respectively,
identifying the method of performing the background operation associated with the current grade of the battery, and
performing the background operation associated with the current grade of the battery,
wherein the memory system includes a controller suitable for storing the information indicating the battery grade,
wherein the controller includes a processor suitable for determining the method based on the information indicating the battery grade, and
wherein the processor sets an execution frequency corresponding to the battery grade as the number of times that the background operation is performed.

17. The data processing system of claim 16, wherein the memory device reduces an execution time of the background operation when the current grade of battery decreases.

18. The data processing system of claim 16, wherein the memory device reduces an execution frequency of the background operation when the current grade of battery decreases.

* * * * *

UNITED STATES PATENT AND TRADEMARK OFFICE
CERTIFICATE OF CORRECTION

| | |
|---|---|
| PATENT NO. | : 11,639,969 B2 |
| APPLICATION NO. | : 16/384231 |
| DATED | : May 2, 2023 |
| INVENTOR(S) | : Eu-Joon Byun |

It is certified that error appears in the above-identified patent and that said Letters Patent is hereby corrected as shown below:

On the Title Page

Please correct item (56) References Cited, OTHER PUBLICATIONS from [[201910795184.3]] to state --201910795183.3--

Signed and Sealed this
Thirteenth Day of June, 2023

Katherine Kelly Vidal
*Director of the United States Patent and Trademark Office*